US010249607B1

United States Patent
Edwards et al.

(10) Patent No.: US 10,249,607 B1
(45) Date of Patent: Apr. 2, 2019

(54) INTERNALLY STACKED NPN WITH SEGMENTED COLLECTOR

(71) Applicant: Texas Instruments Incorporated, Dallas, TX (US)

(72) Inventors: Henry Litzmann Edwards, Garland, TX (US); Akram Ali Salman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/844,035

(22) Filed: Dec. 15, 2017

(51) Int. Cl.
| | | |
|---|---|---|
| H01L 27/02 | (2006.01) | |
| H01L 23/528 | (2006.01) | |
| H01L 29/66 | (2006.01) | |
| H01L 21/8249 | (2006.01) | |
| H01L 29/10 | (2006.01) | |
| H01L 29/08 | (2006.01) | |
| H01L 29/06 | (2006.01) | |
| H01L 29/732 | (2006.01) | |

(52) U.S. Cl.
CPC ...... *H01L 27/0259* (2013.01); *H01L 21/8249* (2013.01); *H01L 23/528* (2013.01); *H01L 29/0649* (2013.01); *H01L 29/0804* (2013.01); *H01L 29/0821* (2013.01); *H01L 29/1004* (2013.01); *H01L 29/66272* (2013.01); *H01L 29/732* (2013.01)

(58) Field of Classification Search
CPC ............... H01L 27/0259; H01L 29/732; H01L 29/0646; H01L 29/0649; H01L 29/0804; H01L 29/0821; H01L 29/66272; H01L 29/1004; H01L 23/528; H01L 21/8249
See application file for complete search history.

(56) References Cited

U.S. PATENT DOCUMENTS

| | | | |
|---|---|---|---|
| 4,056,810 | A | 11/1977 | Hart |
| 4,153,909 | A | 5/1979 | Dobkin |
| 5,477,414 | A * | 12/1995 | Li .................. H01L 27/0251 361/111 |
| 5,623,387 | A | 4/1997 | Li |
| 5,969,923 | A | 10/1999 | Avery |
| 6,479,871 | B2 | 11/2002 | Peters |
| 8,044,457 | B2 | 10/2011 | Salcedo |
| 8,247,839 | B2 | 8/2012 | Van Wijmeersch |
| 8,553,380 | B2 | 10/2013 | Salcedo |
| 8,743,516 | B2 | 6/2014 | Gill |
| 8,866,263 | B2 | 10/2014 | Denison |
| 8,947,841 | B2 | 2/2015 | Salcedo |

(Continued)

FOREIGN PATENT DOCUMENTS

| | | |
|---|---|---|
| CN | 100459118 | 2/2009 |
| JP | H1168044 | 3/1999 |

*Primary Examiner* — Yosef Gebreyesus
(74) *Attorney, Agent, or Firm* — Andrew R. Ralston; Charles A. Brill; Frank D. Cimino

(57) ABSTRACT

An integrated circuit includes a stacked NPN having an upper NPN connected to a lower NPN. The upper NPN includes an upper collector, an upper base, and an upper emitter. The lower NPN includes a lower collector, a lower base, and a lower emitter. The upper collector includes collector segments on opposite sides of the lower emitter. The collector segments are laterally separated by collector separators which are aligned to orientation directions in the collector segments. The upper collector does not have collector separators across the orientation directions.

22 Claims, 9 Drawing Sheets

(56) References Cited

U.S. PATENT DOCUMENTS

| | | |
|---|---|---|
| 8,956,924 B2 | 2/2015 | Domanski |
| 9,153,569 B1 | 10/2015 | Edwards |
| 9,443,840 B2 | 9/2016 | Hsu |
| 9,548,295 B2 | 1/2017 | Domanski |
| 9,633,991 B2 | 4/2017 | Salman |
| 2002/0074602 A1 | 6/2002 | Lin |
| 2004/0169234 A1 | 9/2004 | Yu |
| 2008/0169513 A1* | 7/2008 | Denison ............ H01L 27/0259 257/370 |
| 2009/0032906 A1 | 2/2009 | Ostermann |
| 2009/0212323 A1 | 8/2009 | Liu |
| 2011/0198727 A1 | 8/2011 | Chao |
| 2012/0293904 A1 | 11/2012 | Salcedo |
| 2013/0032882 A1 | 2/2013 | Salcedo |
| 2014/0332843 A1 | 11/2014 | Clarke |
| 2015/0060941 A1* | 3/2015 | Hwang ............ H01L 27/0259 257/173 |

* cited by examiner

INTERNALLY STACKED NPN WITH SEGMENTED COLLECTOR

TECHNICAL FIELD

This disclosure relates to the field of integrated circuits. More particularly, this disclosure relates to stacked NPN bipolar transistor pairs in integrated circuits.

BACKGROUND

An integrated circuit may include a clamp circuit to reduce voltage stress on a protected line, for example, during an electrostatic discharge (ESD) event. The clamp circuit may include a stacked NPN bipolar transistor pair (stacked NPN) having an upper NPN bipolar transistor (upper NPN) in series with a lower NPN bipolar transistor (lower NPN), in which a collector of the upper NPN is coupled to the protected line, an emitter of the upper NPN is coupled to a collector of the lower NPN, and an emitter of the lower NPN is coupled to a ground node of the integrated circuit. Desirable characteristics of the clamp circuit may include low resistance and uniform current distribution during an ESD event, low area of the stacked NPN, and consistent breakdown voltage. The integrated circuit may include analog circuits and may include logic circuits of complementary metal oxide semiconductor (CMOS) transistors, and it may be desirable to integrate the clamp circuit in the integrated circuit without introducing additional process steps. However, in the integrated circuit configuration, it is challenging to achieve values of the resistance, current uniformity, and breakdown voltage in integrated circuits with advanced CMOS transistors.

SUMMARY

The present disclosure introduces an integrated circuit including a stacked NPN bipolar transistor pair (stacked NPN) having an upper NPN bipolar transistor (the upper NPN) connected to a lower NPN bipolar transistor (the lower NPN). The upper NPN includes a collector (the upper collector), a base (the upper base), and an emitter (the upper emitter). The lower NPN includes a collector (the lower collector), a base (the lower base), and an emitter (the lower emitter). The upper emitter is coupled to the lower collector.

The upper collector includes collector segments. Each collector segment has an orientation direction pointing toward the lower emitter. The collector segments are laterally separated by collector separators. Each collector separator is aligned to the orientation directions of the adjacent collector segments. The collector separators block current in the upper collector from flowing across the collector separators. Each collector segment is continuous along the orientation direction through that collector segment. That is, the upper collector does not have collector separators across the orientation directions. The collector segments are located on at least two opposite sides of the lower emitter. A method of forming the integrated circuit is disclosed.

DETAILED DESCRIPTION

Figure 1A:
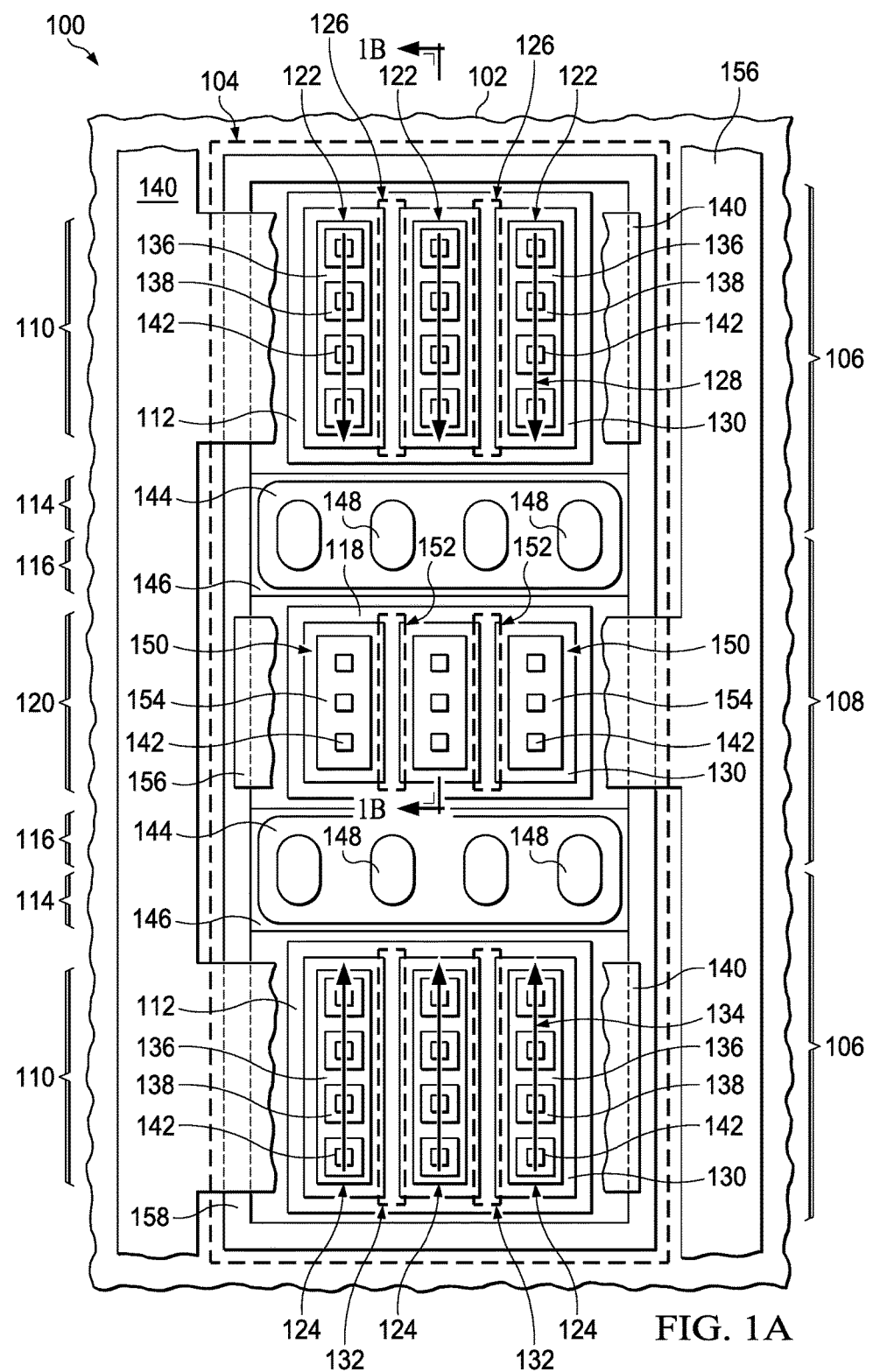
FIG. 1A and FIG. 1B are views of an example integrated circuit which includes a stacked NPN.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated circuit includes a stacked NPN having a first NPN, hereinafter the upper NPN, connected to a second NPN, hereinafter the lower NPN. The upper NPN includes a first collector, hereinafter the upper collector, a first base, hereinafter the upper base, and a first emitter, hereinafter the upper emitter. The lower NPN includes a second collector, hereinafter the lower collector, a second base, hereinafter the lower base, and a second emitter, hereinafter the lower emitter. The upper emitter may be contiguous with the lower collector. The stacked NPN may be part of a clamp circuit between a protected line and a ground line, to reduce voltage stress on the protected line during an ESD event, for example.

The upper collector is divided into collector segments by collector separators; during operation of the integrated circuit, current cannot flow through the upper collector across a collector separator. During operation of the integrated circuit, current flows in each collector segment of the upper collector toward the lower NPN. The upper collector has orientation directions which point along the directions of current flow to the lower emitter. Each collector separator is aligned to the orientation directions of the adjacent collector segments, so as to allow current flow along the orientation directions. Each collector segment is continuous along the orientation direction through that collector segment. The upper collector does not have collector separators across the orientation directions, which can increase a resistance in the upper collector. For the purposes of this disclosure, the term "across" extends to a configuration of the collector separator which would block current along the orientation direction. The collector segments are located on at least two opposite sides of the lower emitter. Segmenting the upper collector may reduce current crowding and thus improve current uniformity. Segmenting the upper collector as described may advantageously reduce a resistance of the stacked NPN while providing a desired uniformity of current flow in the stacked NPN. Distributing the upper collector on opposite sides of the lower emitter, may provide a desired width of the upper collector and so reduce a total resistance of the upper collector, compared with an upper collector located on one side of the lower emitter.

The lower emitter may include an n-type semiconductor region that is laterally surrounded by a field oxide layer, with the n-type semiconductor region directly contacting the lower base. The lower emitter may have emitter separators aligned to the orientation directions in the collector segments nearest the emitter separators. The emitter separators block current flow in the lower emitter across the emitter separators. The lower emitter may be free of emitter separators across orientation directions in the lower emitter. Segmenting the lower emitter as such may advantageously reduce current non-uniformity due to current leakage around a lateral boundary of each emitter segment.

A method of formation of the integrated circuit is disclosed. Elements of the stacked NPN may be formed concurrently with similar elements in other circuits of the integrated circuit, advantageously reducing process complexity and cost.

For the purposes of this disclosure, the term "top surface" of a substrate of the integrated circuit is understood to refer to a surface of the substrate at which active components such as transistors are formed. For the purposes of this disclosure, the terms "lateral" and "laterally" are understood to refer to a direction parallel to a plane of the top surface of the substrate. The term "vertical" is understood to refer to a direction perpendicular to the plane of the top surface of the substrate.

It is noted that terms such as top, bottom, upper, lower, over, above, under, and below may be used in this disclosure. These terms should not be construed as limiting the position or orientation of a structure or element, but should be used to provide spatial relationship between structures or elements.

Figure 1B:
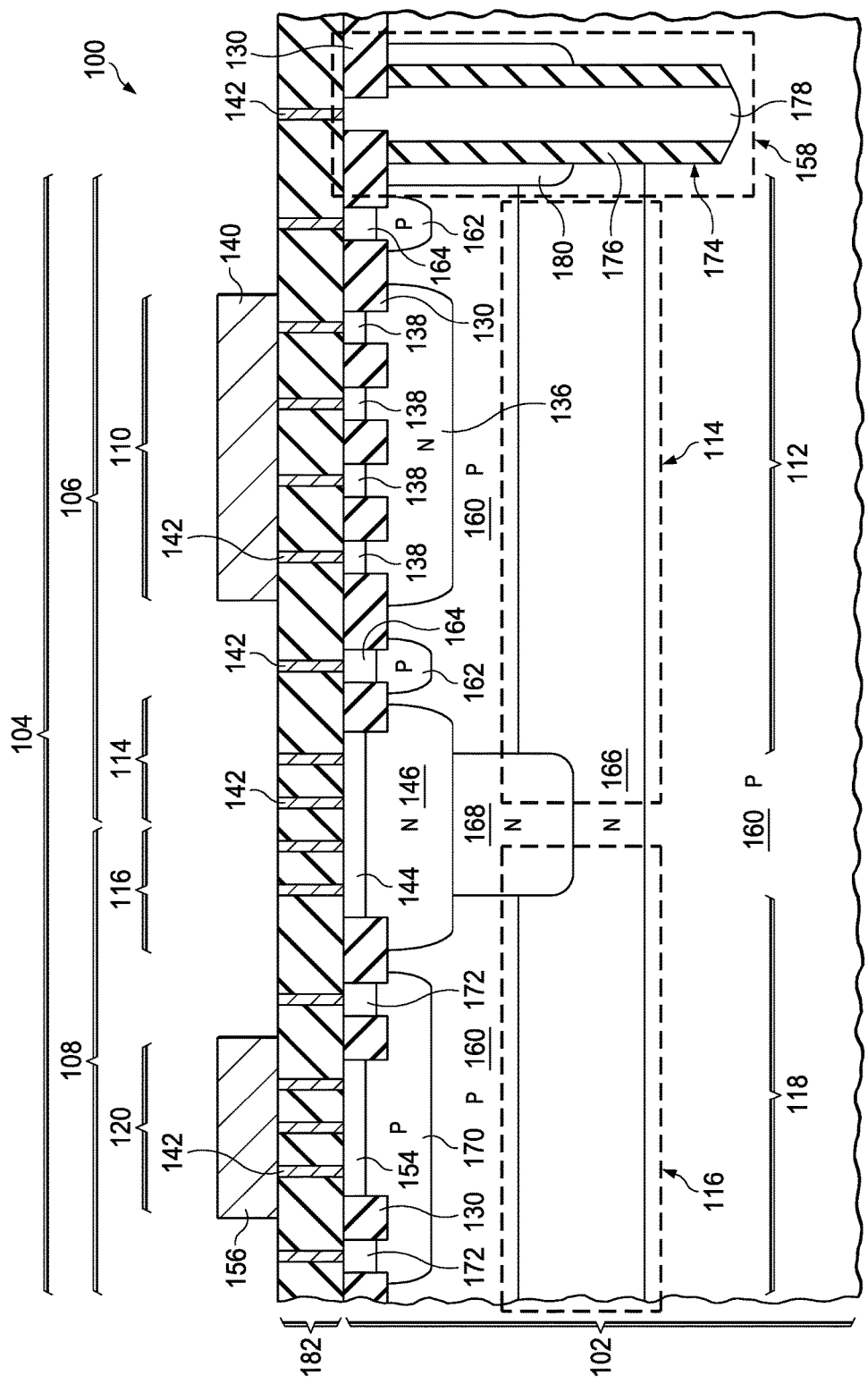

FIG. 1A and FIG. 1B are views of an example integrated circuit which includes a stacked NPN. Referring to FIG. 1A, which is a top view, the integrated circuit 100 has a substrate 102 which includes a semiconductor material such as silicon or other type IV semiconductor material. Other semiconductor materials are within the scope of the instant example. The substrate 102 may be a portion of a semiconductor wafer, such as a bulk semiconductor wafer, a silicon-on-insulator (SOI) wafer, or a semiconductor wafer with a semiconductor epitaxial layer. The integrated circuit 100 includes a stacked NPN 104.

The stacked NPN 104 has an upper NPN 106 and a lower NPN 108 connected in series. The upper NPN 106 has an upper collector 110 of n-type semiconductor material in the substrate 102, an upper base 112 of p-type semiconductor material in the substrate 102, and an upper emitter 114 of n-type semiconductor material in the substrate 102. The lower NPN 108 includes a lower collector 116 of n-type semiconductor material in the substrate 102, a lower base 118 of p-type semiconductor material in the substrate 102, and a lower emitter 120 of n-type semiconductor material in the substrate 102. The upper emitter 114 may be contiguous with the lower collector 116.

The upper collector 110 is divided into first collector segments 122 on a first side of the lower NPN 108, and into second collector segments 124 on a second, opposite, side of the lower NPN 108. The first collector segments 122 are laterally separated by first collector separators 126 which are aligned to first orientation directions 128 in the first collector segments 122. The first orientation directions 128 point to the lower NPN 108. In the instant example, the first orientation directions 128 may be parallel to each other. Similarly, the second collector segments 124 are laterally separated by second collector separators 132 which are aligned to second orientation directions 134 in the second collector segments 124. In the instant example, the second orientation directions 134 may be parallel to each other. Each first collector segment 122 is continuous along the first orientation direction 128 of that first collector segment 122. Similarly, each second collector segment 124 is continuous along the second orientation direction 134 of that second collector segment 124. The upper collector 110 does not have collector separators 126 or 132 between the collector segments 122 and 124, respectively, that are located across the orientation directions 128 and 134. Each of the collector segments 122 and 124 may have first lateral dimensions, that is, lengths, along the orientation directions 128 and 134 which are greater than second lateral dimensions, that is, widths, that are perpendicular to the orientation directions 128 and 134. In the instant example, the first collector separators 126 may include a field oxide layer 130, and may include portions of the upper base 112 which extend between the first collector segments 122. Each of the first collector segments 122 and second collector segments 124 includes first n-type wells 136 in the substrate 102, and first n-type active areas 138 on the first n-type wells 136. The first n-type active areas 138 may be coupled to a protected line 140 through contacts 142 on the first n-type active areas 138.

In the instant example, the upper base 112 extends under the upper collector 110 to the upper emitter 114. The upper base 112 may include a first p-type well in the substrate 102 laterally surrounding the first n-type wells 136, and a first portion of p-type semiconductor material in the substrate 102 extending below the first n-type wells 136.

In the instant example, the upper emitter 114 includes a first portion of a second n-type active area 144 on a first portion of a second n-type well 146. The upper emitter 114 further includes a first portion of an n-type buried layer, not shown in FIG. 1A, that extends below the upper base 112. The n-type buried layer is connected to the second n-type well 146 by vertical n-type regions, also not shown in FIG. 1A. The vertical n-type regions may laterally surround deep trenches 148. The deep trenches 148 may advantageously provide segmentation in the upper emitter 114 to improve current uniformity through the upper emitter 114.

The lower collector 116 of the instant example includes a second portion of the second n-type active area 144 on a second portion of the second n-type well 146. The lower collector 116 further includes a second portion of the n-type buried layer that extends below the lower base 118. The lower collector 116 may be contiguous with the upper emitter 114 in the second n-type active area 144, the second n-type well 146, and the n-type buried layer.

The lower base 118 may include a second p-type well in the substrate 102, and a second portion of the p-type material over the second portion of the n-type buried layer in the lower collector 116. The lower base 118 extends under the lower emitter 120. The lower emitter 120 may be segmented into emitter segments 150 by emitter separators 152 which are aligned to the first orientation directions 128 or to the second orientation directions 134. The emitter separators 152 block current in the lower emitter 120 from flowing across the emitter separators 152. The emitter separators 152 may include the field oxide layer 130, and may include portions of the lower base 118 which extend between the emitter segments 150. The lower emitter 120 does not have emitter separators 152 between the emitter segments 150 that are perpendicular to the orientation directions 128 and 134. Each of the emitter segments 150 includes emitter n-type active areas 154 on the second p-type well of the lower base 118. The emitter n-type active areas 154 may be coupled to a ground line 156 through additional contacts 142 on the first n-type active areas 138.

Dividing the upper collector 110 into the first collector segments 122 and the second collector segments 124 on opposite sides of the lower NPN 108 may advantageously reduce resistance in the upper collector 110 by increasing a width of the upper collector 110 compared to a stacked NPN with an upper collector located only on one side of a lower NPN. Locating the first collector segments 122 and the second collector segments 124 on opposite sides of the lower NPN 108 may advantageously provide more uniform current in the lower emitter 120 compared to a stacked NPN having an upper collector located only on one side of a lower NPN, by flowing current into the lower NPN 108 from both sides.

Segmenting the upper collector 110 into the first collector segments 122 and the second collector segments 124 may advantageously reduce current crowding, sometimes referred to a current hogging or filamentation, from the upper collector 110 into the upper base 112. Having no collector separators 126 or 132 in the upper collector 110 across the orientation directions 128 and 134, respectively, may advantageously improve current uniformity for versions of the integrated circuit 100 which have significant perimeter current components in active areas, that is, where current around a perimeter of an active area is higher than current through the middle of the active area. Generally, depths of heavily doped regions, such as source and drain regions, in active areas have become more shallow as technology nodes for logic circuits have progressed, and perimeter current as a fraction of total current has increased as a result. Similar benefits may accrue from segmenting the lower emitter 120 into the emitter segments 150 with the emitter separators 152 aligned to, and not perpendicular to, the orientation directions 128 and 134.

The stacked NPN 104 is surrounded by an isolation structure 158 which extends around the stacked NPN 104. One manifestation of the isolation structure 158 will be described in the instant example. Other architectures and configurations for the isolation structure 158 are within the scope of the instant example.

Referring to FIG. 1B, which is a cross section, the integrated circuit 100 has the substrate 102 which includes the semiconductor material 160 referred to, but not shown, in FIG. 1A. In the instant example, the semiconductor material 160 is p-type, and may be a portion of a base wafer.

The upper collector 110 of the upper NPN 106 includes the first n-type wells 136 in the substrate 102, and the first n-type active areas 138 on the first n-type wells 136. The first n-type active areas 138 are separated by the field oxide layer 130. The field oxide layer 130 may have a shallow trench isolation (STI) structure, may have a local oxidation of silicon (LOCOS) structure, or may have another structure. In the instant example, the field oxide layer 130 has an STI structure, which has silicon dioxide disposed in isolation trenches in the substrate 102; the isolation trenches have substantially straight sides and are wider at tops of the isolation trenches than at bottoms of the isolation trenches. A top surface of the field oxide layer 130 with an STI structure may be substantially coplanar with a top surface of the substrate 102 adjacent to the field oxide layer 130. A LOCOS structure has a layer of silicon dioxide with tapered edges, sometimes referred to as birds beaks; approximately half of the silicon dioxide is located below the top surface of the adjacent substrate 102 and the remainder is located higher than the top surface.

The upper base 112 includes the first portion of the semiconductor material 160, which is p-type, the first p-type well 162 which laterally surrounds the first n-type wells 136, and upper base contact regions 164, which are p-type, on the first p-type well 162.

The upper emitter 114 includes the first portion of the second n-type active area 144 on the first portion of the second n-type well 146. The upper emitter 114 further includes the first portion of the n-type buried layer 166 which extends below the upper base 112. The n-type buried layer 166 is connected to the second n-type well 146 by vertical n-type regions 168 which surround the deep trenches 148 of FIG. 1A, if present.

The lower collector 116 includes the second portion of the second n-type active area 144 on the second portion of the second n-type well 146. The lower collector 116 further includes the second portion of the n-type buried layer 166 which extends below the lower base 118. The vertical n-type regions 168 connect the second portion of the second n-type well 146 with the second portion of the n-type buried layer 166.

The lower base 118 includes the second portion of the semiconductor material 160 which is over the second portion of the n-type buried layer 166, and the second p-type well 170 below the lower emitter 120.

The lower emitter 120 includes the emitter n-type active areas 154 on the second p-type well 170. The emitter n-type active areas 154 are laterally surrounded by lower base contact regions 172, which are p-type, on the second p-type well 170. The emitter n-type active areas 154 are laterally separated from the lower base contact regions 172 by the field oxide layer 130.

The isolation structure 158 may include a deep trench 174 with a silicon dioxide liner 176 and a core 178 of p-type polycrystalline silicon which makes contact with the semiconductor material 160 below the n-type buried layer 166. Vertical n-type regions 180 may be located around the deep trench 174. Other architectures for the isolation structure 158, such as deep n-type regions referred to as sinkers, are within the scope of the instant example.

A dielectric layer 182 is disposed over the substrate 102. The dielectric layer 182 may be, for example, a pre-metal dielectric (PMD) layer 182 which may include one or more sub-layers of dielectric material, for example, a PMD liner of silicon nitride directly over the substrate 102, a main dielectric layer of silicon dioxide-based material such as phosphorus silicate glass (PSG) or boron phosphorus silicate glass (BPSG) on the PMD liner, and a cap layer of silicon dioxide, silicon nitride, silicon oxynitride, silicon carbide or silicon carbide nitride on the main dielectric layer. Other layer structures and compositions for the dielectric layer 182 are within the scope of the instant example.

Contacts 142 are disposed through the dielectric layer 182 to provide electrical connections to the elements of the stacked NPN 104. The contacts 142 may include a liner containing titanium, a barrier layer including tantalum nitride or titanium nitride on the liner, and a core of tungsten on the barrier layer. The protected line 140, which may be an interconnect line on the dielectric layer 182, is coupled to the upper collector 110 through instances of the contacts 142. Similarly, the ground line 156, which may also be an interconnect line on the dielectric layer 182, is coupled to the lower emitter 120 through instances of the contacts 142. Any of the upper base 112, the upper emitter 114 and the lower collector 116, and the lower base 118 may be coupled to trigger circuits through instances of the contacts 142.

Figure 2A:
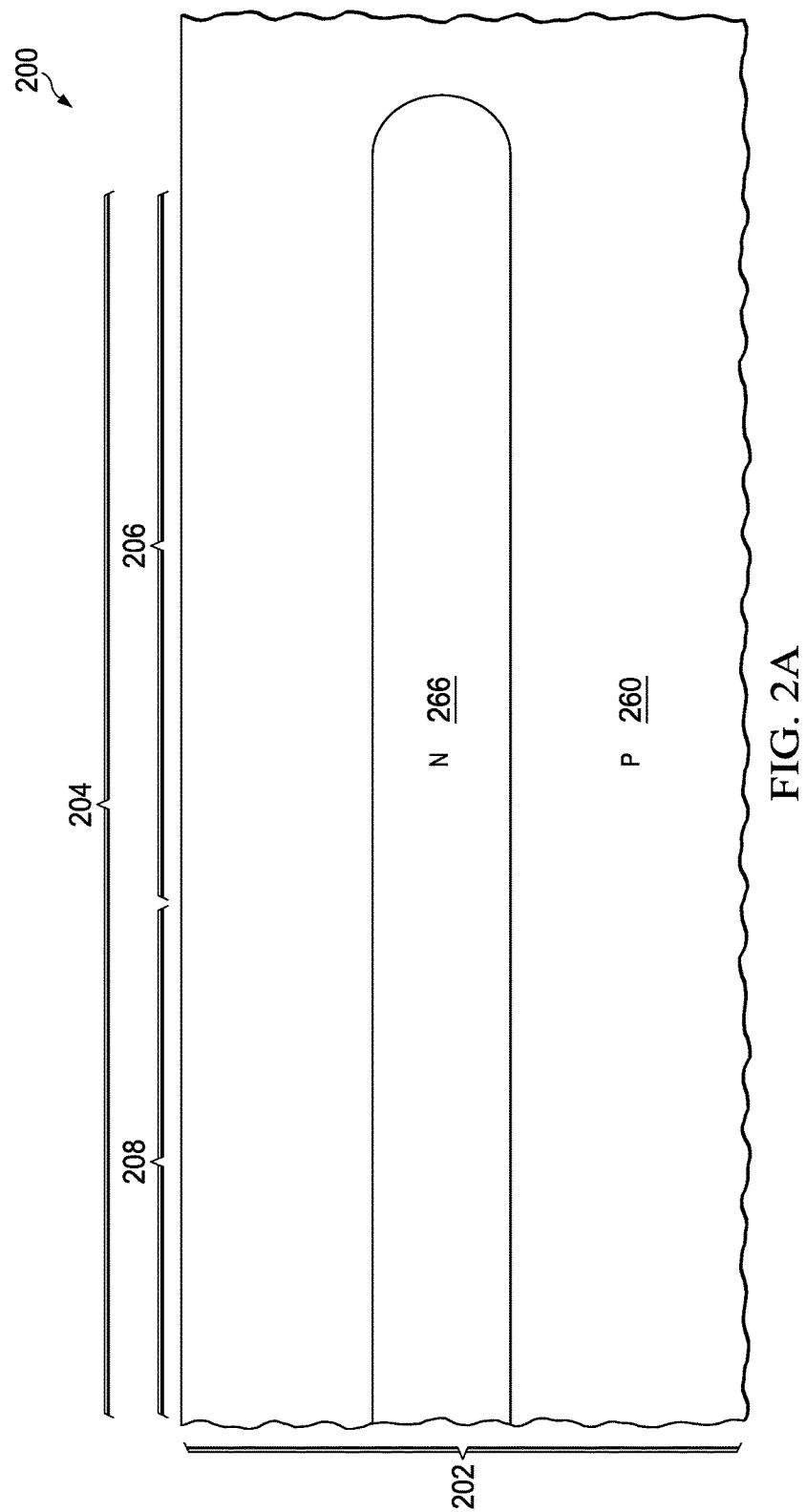
FIG. 2A through FIG. 2F are cross sections of an integrated circuit which includes a stacked NPN, depicted in stages of an example method of formation.

FIG. 2A through FIG. 2F are cross sections of an integrated circuit which includes a stacked NPN, depicted in stages of an example method of formation. Referring to FIG. 2A, the integrated circuit 200 is formed in and on a substrate 202 which includes semiconductor material 260. The substrate 202 may be, for example, a semiconductor wafer. In the instant example, the semiconductor material 260 is p-type.

An n-type buried layer 266 is formed in the substrate 202 in an area for the stacked NPN 204. The n-type buried layer 266 may be formed by implanting n-type dopants such as antimony and possibly arsenic into a base portion of the substrate 202, heating the base portion to diffuse the implanted n-type dopants, and forming an epitaxial layer on the base portion. The n-type dopants may be implanted with a total dose of $5 \times 10^{14}$ cm$^{-2}$ to $3 \times 10^{15}$ cm$^{-2}$, for example. During formation of the epitaxial layer, the implanted n-type dopants diffuse further downward into the base portion, and upward into the epitaxial layer, to form the n-type buried layer 266. The base portion and the epitaxial layer provide the substrate 202. The epitaxial layer includes p-type semiconductor material which is part of the semiconductor material 260. Other methods of forming the n-type buried layer 266, such as implanting n-type dopants at high energy into the substrate 202, are within the scope of the instant example. The n-type buried layer 266 of the instant example extends continuously across an area for an upper NPN 206 of the stacked NPN 204 and an area for a lower NPN 208 of the stacked NPN 204.

Figure 2B:
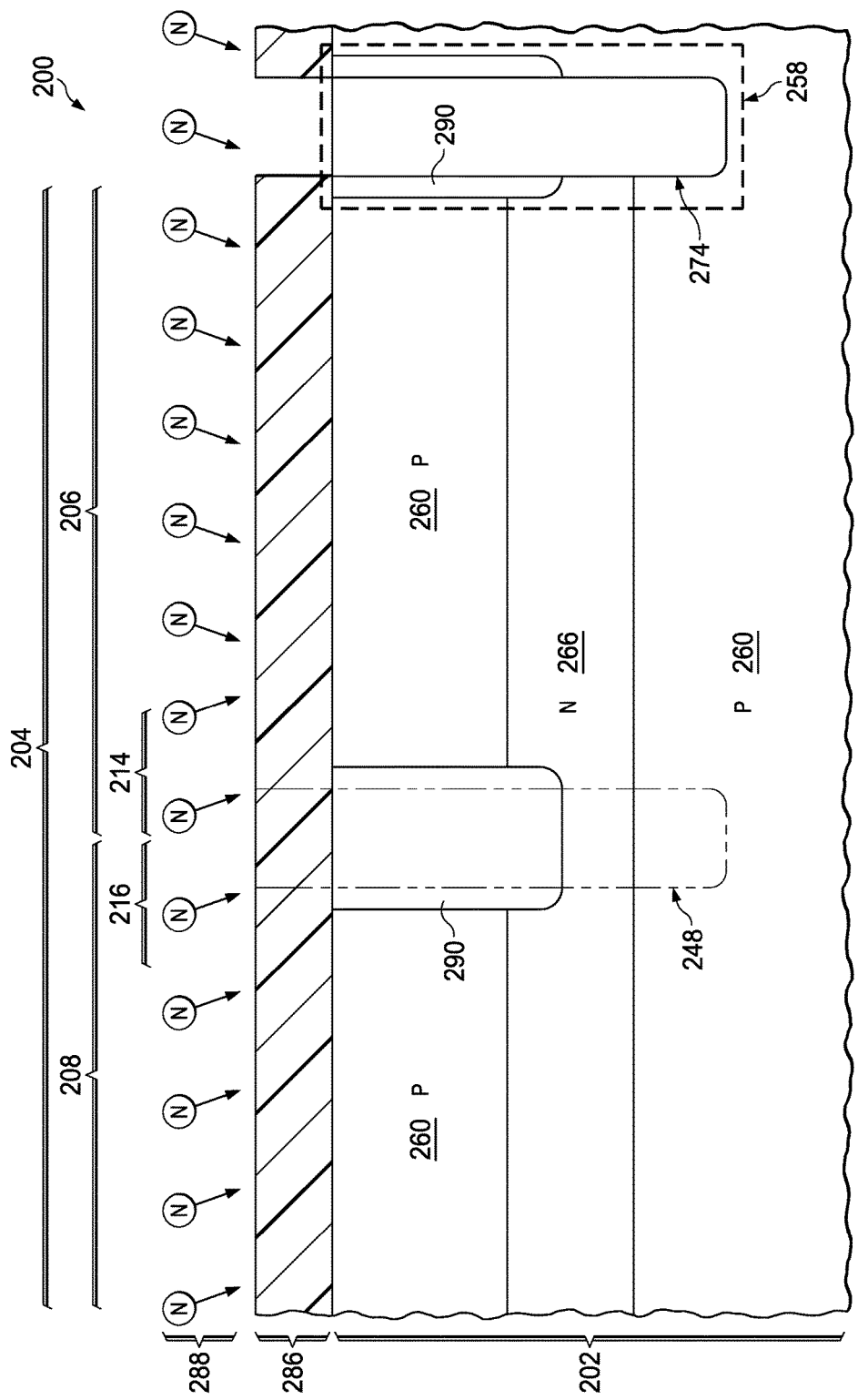

Referring to FIG. 2B, a deep trench mask 286 is formed over the substrate 202. The deep trench mask 286 may include hard mask material such as silicon dioxide or silicon nitride. The deep trench mask 286 exposes an area for a deep trench 274 of an isolation structure 258. The area for the deep trench 274 of the isolation structure 258 laterally surrounds the area for the stacked NPN 204. The deep trench mask 286 also exposes areas for a plurality of deep trenches 248 extending into an area for an upper emitter 214 of the upper NPN 206 and into an area for a lower collector 216 of the lower NPN 208. The areas for the upper emitter 214 and the lower collector 216 are contiguous. The areas for the deep trenches 248 extend in a line perpendicular to the plane of FIG. 2B. The deep trench 274 and the plurality of deep trenches 248 may be formed concurrently. The deep trench 274 and the plurality of deep trenches 248 may be formed by any of several deep reactive ion etch (DRIE) processes, including a continuous DRIE process which forms a protective polymer on sidewalls of the deep trench 274 and the plurality of deep trenches 248 while simultaneously etching semiconductor material 260 from bottoms of the deep trench 274 and the plurality of deep trenches 248, or a two-step DRIE process, sometimes referred to as a Bosch DRIE process, which forms the protective polymer and etches the semiconductor material 260 in separate alternating steps.

The deep trench 274 of the isolation structure 258 laterally surrounds the area for the stacked NPN 204 and intersects the n-type buried layer 266 around a perimeter of the area for the stacked NPN 204. The deep trenches 248 extend in a line perpendicular to the plane of FIG. 2B, and the instance of the deep trenches 248 shown in FIG. 2B is out of the plane of FIG. 2B and so is depicted in dashed lines. The deep trench 274 and the plurality of deep trenches 248 are formed to extend below the n-type buried layer 266.

N-type dopants 288 are implanted into the substrate 202 along sidewalls of the deep trench 274 and the plurality of deep trenches 248 to form vertical implanted layers 290 along the sidewalls of the deep trench 274 and the plurality of deep trenches 248 down to the n-type buried layer 266. The n-type dopants 288 may include phosphorus and arsenic, and may be implanted in several steps at tilt angles of 20 degrees to 30 degrees from a vertical axis perpendicular to a top surface of the substrate 202. The n-type dopants 288 may be implanted at a total dose of $3 \times 10^{14}$ cm$^{-2}$ to $3 \times 10^{15}$ cm$^2$, for example, to attain a desired conductivity in subsequently-formed vertical n-type regions.

Figure 2C:
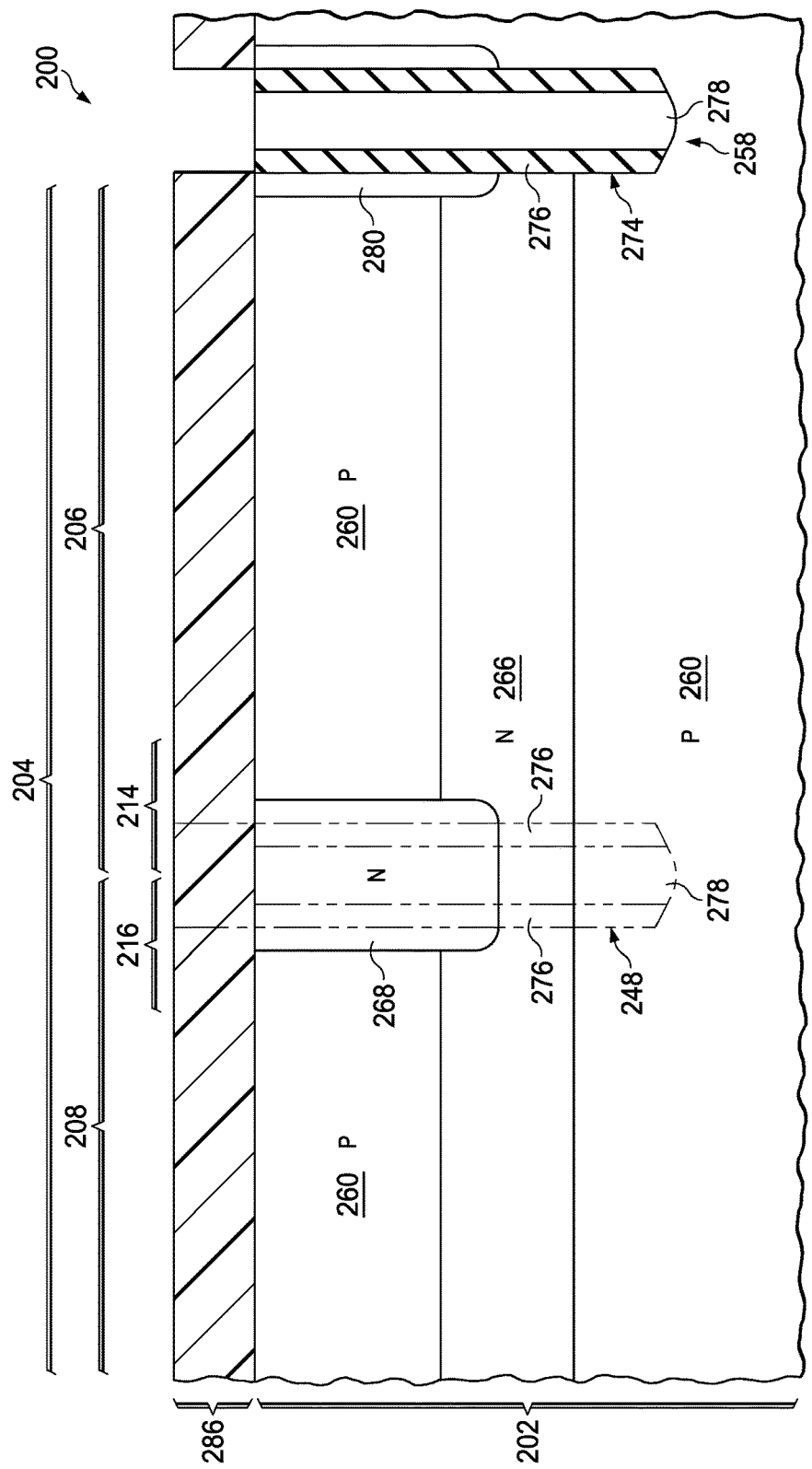

Referring to FIG. 2C, silicon dioxide liners 276 are formed on sidewalls of the deep trench 274 and the plurality of deep trenches 248. The silicon dioxide liners 276 may be formed, for example, by a thermal oxidation process. The implanted n-type dopants 288 of FIG. 2B in the vertical implanted layers 290 of FIG. 2B are activated to form vertical n-type regions 280 along the deep trench 274, and form a continuous vertical n-type region 268 around the plurality of deep trenches 248. The thermal oxidation process may provide adequate thermal profile to activate the implanted n-type dopants 288; otherwise, an additional anneal may be employed.

Cores 278 are formed on the silicon dioxide liners 276 in the deep trench 274 and the plurality of deep trenches 248. The cores 278 may include p-type polycrystalline silicon or other electrically conductive material. The cores 278 make electrical connections to the semiconductor material 260 below the n-type buried layer 266. The deep trench mask 286 is removed. The deep trench mask 286 may be removed prior to forming the cores 278 or after forming the cores 278.

Figure 2D:
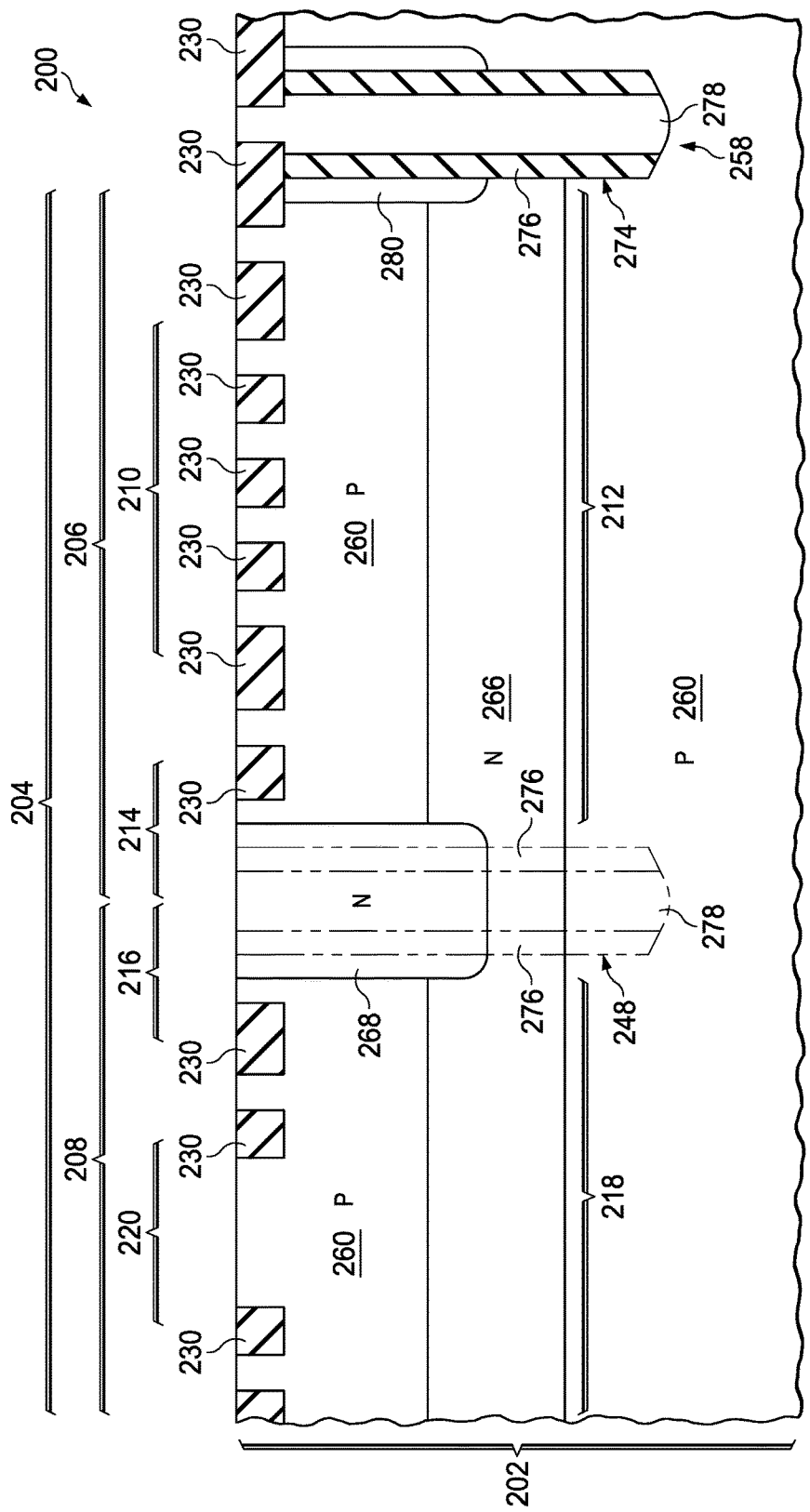

Referring to FIG. 2D, field oxide layer 230 is formed on the substrate 202. The field oxide layer 230 may be formed by an STI process, by a LOCOS process, or by another process. An example STI process includes forming a CMP stop layer of silicon nitride over the substrate 202, etching isolation trenches through the CMP stop layer and into the substrate 202, and filling the isolation trenches with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a subatmospheric chemical vapor deposition (SACVD) process using dichlorosilane. Excess silicon dioxide is removed from over the CMP stop layer by an oxide chemical mechanical polish (CMP) process, and the CMP stop layer is subsequently removed, leaving the field oxide layer 230. An example LOCOS process includes forming a silicon nitride mask layer over a layer of LOCOS pad oxide over the substrate 202. The silicon nitride mask layer is removed in areas for the field oxide layer 230, exposing the LOCOS pad oxide. Silicon dioxide is formed in the areas exposed by the silicon nitride mask layer by thermal oxidation, to form the field oxide layer 230. The silicon nitride mask layer is subsequently removed, leaving the field oxide layer 230 in place.

The field oxide layer 230 is located so as to provide parts of collector separators in the area for the upper collector 210 of the upper NPN 206. The field oxide layer 230 also laterally separates the areas for the upper collector 210, an upper base 212, and the upper emitter 214, all of the upper NPN 206, and the lower collector 216, a lower base 218 and a lower emitter 220, all of the lower NPN 208. In the instant example, the field oxide layer 230 does not separate the area for the upper emitter 214 from the lower collector 216.

Figure 2E:
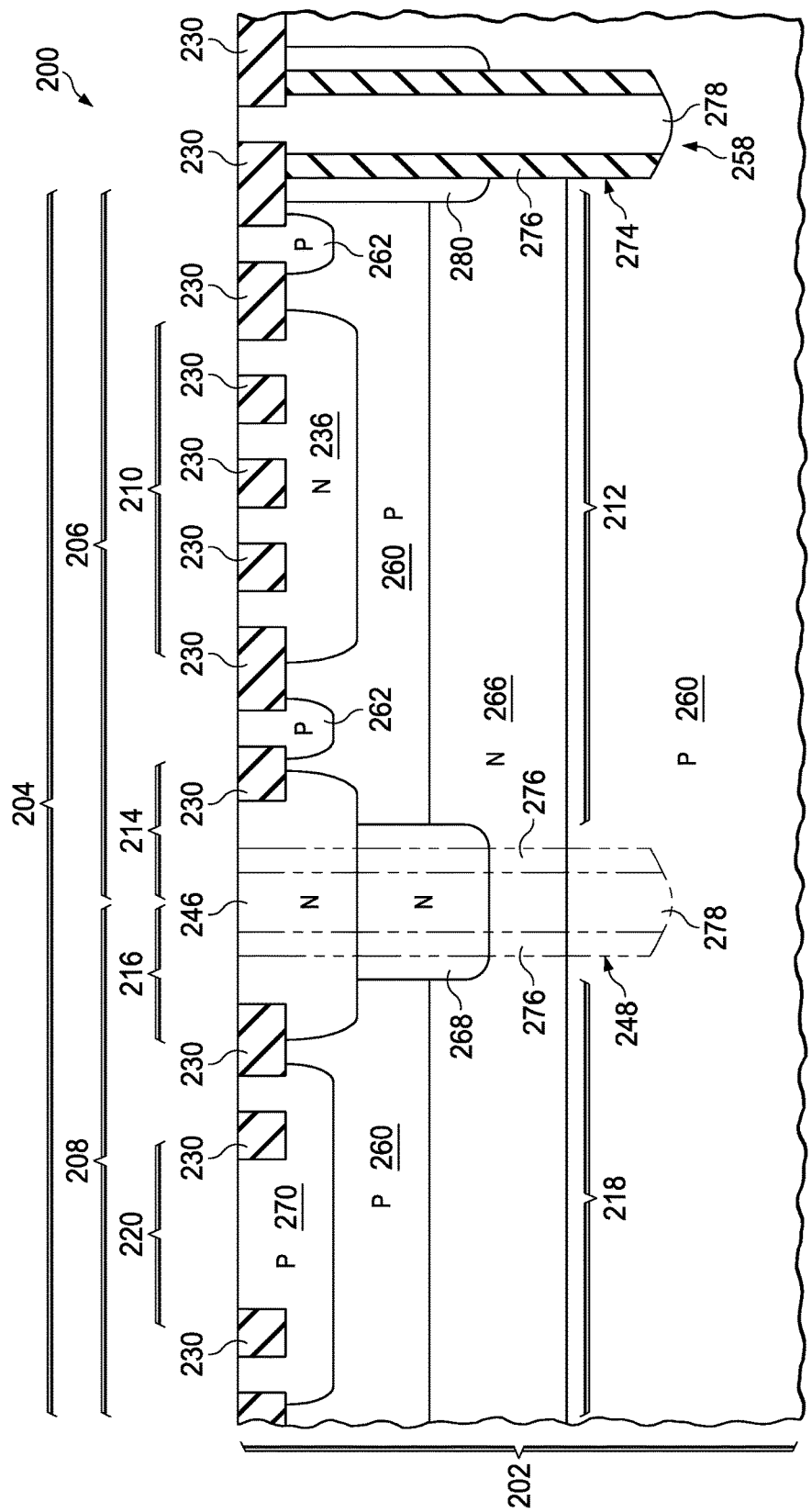

Referring to FIG. 2E, a first p-type well 262 is formed in the substrate 202 as part of the upper base 212. A second p-type well 270 is formed in the substrate 202 as part of the lower base 218. The first p-type well 262 and the second p-type well 270 may be formed concurrently with other p-type wells containing n-channel metal oxide semiconductor (NMOS) transistors in the integrated circuit 200. The first p-type well 262 and the second p-type well 270 may be formed by implanting p-type dopants such as boron into the substrate 202 at a total dose of $3 \times 10^{13}$ cm$^{-2}$ to $1 \times 10^{14}$ cm$^{-2}$, for example.

A plurality of first n-type wells 236, one of which is shown in FIG. 2E, is formed in the substrate 202 as part of the upper collector 210. A second n-type well 246 is formed in the substrate 202 as part of the upper emitter 214 and part of the lower collector 216. The first n-type wells 236 and the second n-type well 246 may be formed by implanting n-type dopants such as phosphorus and arsenic into the substrate 202 at a total dose of $3\times10^{13}$ cm$^{-2}$ to $1\times10^{14}$ cm$^{-2}$, for example. The first n-type wells 236 and the second n-type well 246 may be formed concurrently with other n-type wells containing p-channel metal oxide semiconductor (PMOS) transistors in the integrated circuit 200.

Figure 2F:
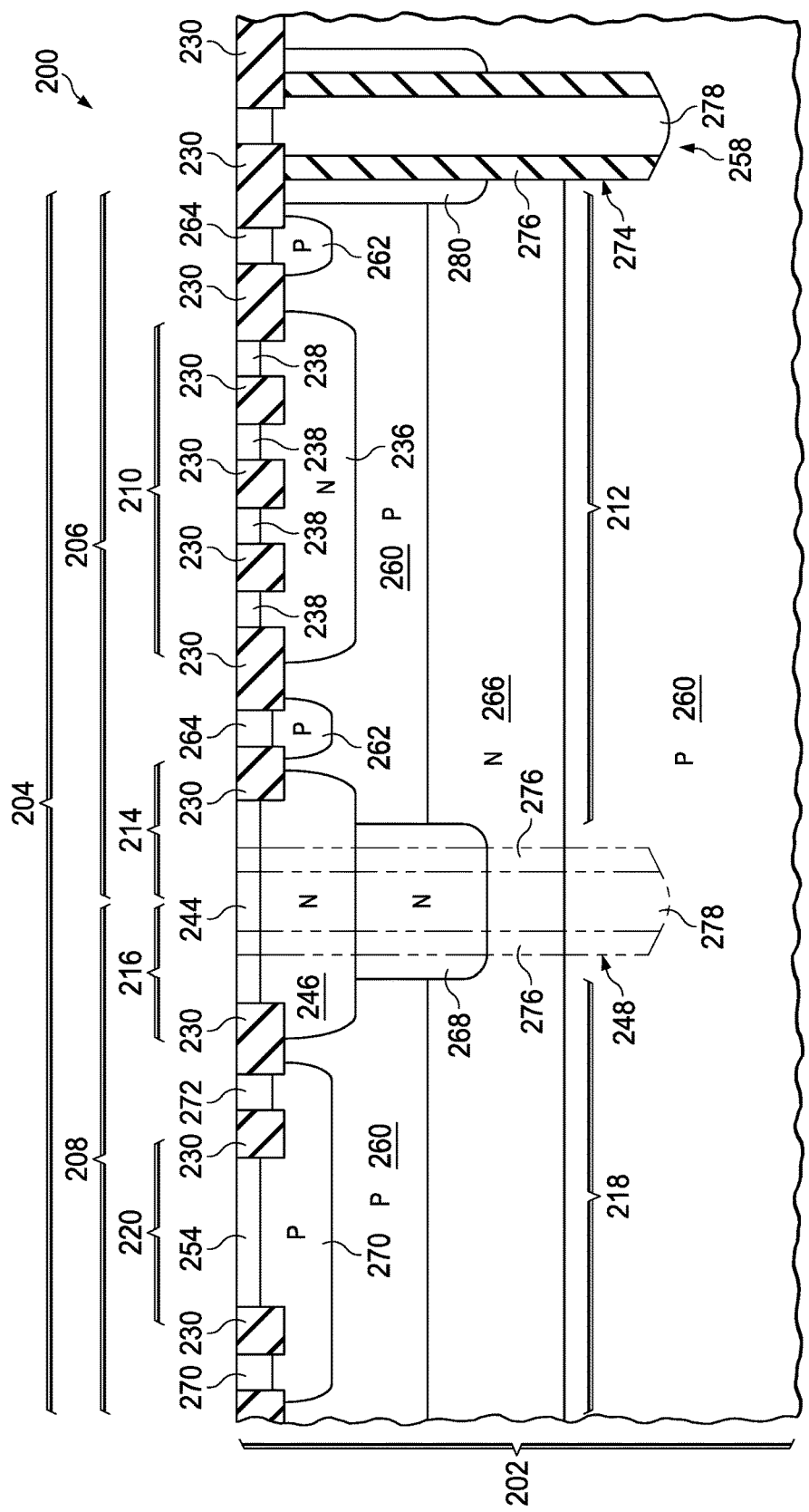

Referring to FIG. 2F, n-type regions are formed concurrently in the substrate 202 to provide source and drain regions for NMOS transistors, contact regions for n-type wells, and such. The n-type regions include first n-type active areas 238 on the first n-type wells 236 in the upper collector 210, a second n-type active area 244 on the second n-type well 246 in the upper emitter 214 and the lower collector 216, and emitter n-type active areas 254 of the lower emitter 220 on the second p-type well 270 of the lower base 218. The n-type regions may be formed by implanting n-type dopants such as phosphorus, arsenic, and antimony, into the substrate 202 at a total dose of $3\times10^{14}$ cm$^{-2}$ to $1\times10^{16}$ cm$^{-2}$, for example.

P-type regions are formed concurrently in the substrate 202 to provide source and drain regions for PMOS transistors, contact regions for p-type wells, and such. The p-type regions include upper base contact regions 264 on the first p-type well 262 of the upper base 212, and lower base contact regions 272 on the second p-type well 270 of the lower base 218. The p-type regions may be formed by implanting p-type dopants such as boron, gallium, and possibly indium, into the substrate 202 at a total dose of $3\times10^{14}$ cm$^{-2}$ to $1\times10^{16}$ cm$^{-2}$, for example.

Forming the elements of the stacked NPN 204, such as the p-type wells 262 and 270, the n-type wells 236 and 246, the n-type regions 238, 244, and 254, and the p-type regions 264 and 272, concurrently with corresponding elements of the NMOS transistors and PMOS transistors may advantageously reduce fabrication cost and complexity of the integrated circuit 200.

Figure 3:
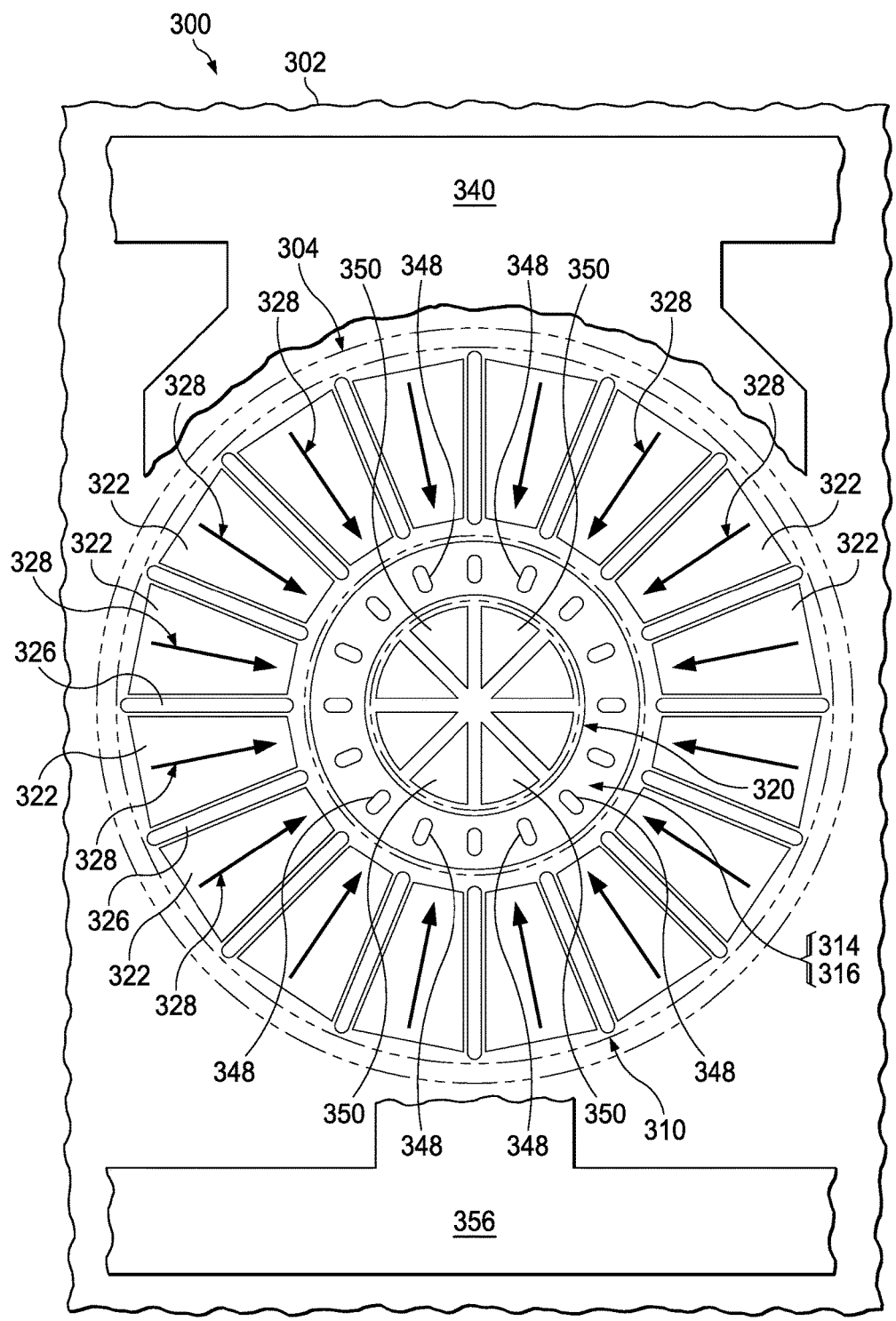
FIG. 3 is a top view of another example integrated circuit which includes a stacked NPN.

FIG. 3 is a top view of another example integrated circuit which includes a stacked NPN. The integrated circuit 300 is formed on a substrate 302, for example, as described in reference to FIG. 1A and FIG. 1B. In the instant example, the stacked NPN 304 has a concentric configuration, in which an upper collector 310 has collector segments 322 arranged radially at least partially around a lower emitter 320. The collector segments 322 are disposed on at least two opposite sides of the lower emitter 320; in the instant example, the collector segments 322 are disposed on all sides of the lower emitter 320. Current flows through the collector segments 322 toward the lower emitter 320, as indicated by orientation directions 328. Adjacent pairs of the collector segments 322 are separated by collector separators 326 which are aligned to orientation directions 328 in the collector segments 322. The collector separators 326 block current in the upper collector 310 from flowing across the collector separators 326. The collector separators 326 may include field oxide, p-type active areas, or other current blocking structures. Each collector segment 322 is continuous along the orientation direction 328 of that collector segment 322. The upper collector 310 does not have separators between adjacent pairs of the collector segments 322 across the orientation directions 328 in the adjacent collector segments 322. The concentric configuration of the upper collector 310 may advantageously improve a current capacity of the stacked NPN 304, because the concentric configuration provides a greater width for the upper collector 310 while maintaining a low resistance path to the lower emitter 320.

The lower emitter 320 may optionally be divided into emitter segments 350, to reduce current crowding in the lower emitter 320. The lower emitter 320 is separated from the upper collector 310 by a combined upper emitter 314 and lower collector 316, disposed around the lower emitter 320. The combined upper emitter 314 and lower collector 316 may be segmented by deep trenches 348 to reduce current crowding in the combined upper emitter 314 and lower collector 316.

The upper collector 310 may be connected to a protected line 340 which extends over the collector segments 322. Similarly, the lower emitter 320 may be connected to a ground line 356 which extends over the emitter segments 350. The concentric configuration, depicted in FIG. 3, may be conducive to short distances between the upper collector 310 and the protected line 340, and between the lower emitter 320 and the ground line 356, as depicted in FIG. 3, advantageously reducing a resistance between the protected line 340 and the ground line 356 through the stacked NPN 304.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:
1. An integrated circuit, comprising:
a substrate including a semiconductor material; and
a stacked NPN bipolar transistor pair (stacked NPN), including:
a first NPN bipolar transistor (first NPN), including a first collector including collector segments of a first n-type semiconductor material in the substrate; and
a second NPN bipolar transistor (second NPN), including a second collector coupled to a first emitter of the first NPN, and a second emitter including a second n-type semiconductor material in the substrate;
wherein:
each collector segment has an orientation direction that points to the second emitter;
adjacent collector segments are laterally separated by collector separators, the collector separators electrically isolating the adjacent collector segments from each other;
said each collector segment is continuous along the orientation direction of said each collector segment; and
the collector segments are located on at least two opposite sides of the second emitter.
2. The integrated circuit of claim 1, wherein each of the collector segments includes an n-type well on a first base.
3. The integrated circuit of claim 1, wherein the collector separators include p-type semiconductor material in the substrate.
4. The integrated circuit of claim 1, wherein the collector separators include portions of a field oxide layer.

5. The integrated circuit of claim 1, wherein the first emitter includes a portion of an n-type buried layer, the portion of the n-type buried layer extending under a first base.

6. The integrated circuit of claim 5, wherein the first emitter includes a portion of an n-type well connected to the portion of the n-type buried layer by a portion of a vertical n-type region.

7. The integrated circuit of claim 5, wherein the second collector includes a portion of an n-type buried layer, the portion of the n-type buried layer extending under a second base.

8. The integrated circuit of claim 7, wherein the second collector includes a portion of an n-type well connected to the portion of the n-type buried layer by a portion of a vertical n-type region.

9. The integrated circuit of claim 7, wherein:
the second base includes a p-type well in the substrate; and
the second emitter includes n-type active areas on the p-type well.

10. The integrated circuit of claim 1, wherein the first emitter is contiguous with the second collector.

11. The integrated circuit of claim 1, wherein:
the collector segments include first collector segments on a first side of the second emitter, wherein the orientation direction in each of the first collector segments is parallel to the orientation direction of each other of said first collector segment; and
the collector segments include second collector segments on a second side of the second emitter opposite from the first side, wherein the orientation direction in each of the second collector segments is parallel to the orientation direction of each other of said second collector segment.

12. The integrated circuit of claim 1, wherein the stacked NPN has a concentric configuration wherein the collector segments are located at least partially around the second emitter.

13. The integrated circuit of claim 1, wherein the first collector is connected to a protected line of the integrated circuit, the protected line including an interconnect line.

14. The integrated circuit of claim 1, wherein the second emitter is connected to a ground line of the integrated circuit, the ground line including an interconnect line.

15. The integrated circuit of claim 1, wherein the second emitter includes emitter separators, wherein each emitter separator is aligned to the orientation direction in adjacent collector segments, wherein the emitter separators block current flow in the second emitter across the emitter separators.

16. A method of forming an integrated circuit, comprising:
providing a substrate including a semiconductor material, the substrate including an area for a stacked NPN bipolar transistor pair (stacked NPN), the stacked NPN including an area for a first NPN bipolar transistor (first NPN) and an area for a second NPN bipolar transistor (second NPN), the area for the first NPN including an area for a first collector, an area for a first base, and an area for a first emitter, the area for the second NPN including an area for a second collector, an area for a second base, and an area for a second emitter; and
forming n-type regions in the area for the first collector, wherein the n-type regions include collector segments, wherein:
each collector segment has an orientation direction that points to the second emitter;
adjacent pairs of the collector segments are laterally separated by a collector separator that is aligned to the orientation direction in the adjacent collector segments;
the first collector is free of a collector separator adjacent to a collector segment wherein the collector separator is perpendicular to the orientation direction in the collector segment; and
the collector segments are located on at least two opposite sides of the second emitter.

17. The method of claim 16, wherein forming the n-type regions includes forming first n-type wells, wherein each collector segment includes at least one of the first n-type wells, and wherein the first n-type wells are formed concurrently with other n-type wells containing p-channel metal oxide semiconductor (PMOS) transistors in the integrated circuit.

18. The method of claim 16, further comprising forming a field oxide layer, wherein the collector separators include portions of the field oxide layer.

19. The method of claim 16, further comprising forming emitter separators in an area for the second emitter, wherein each emitter separator is aligned to the orientation direction in the collector segments nearest the emitter separator, wherein the emitter separators block current flow in the second emitter across the emitter separators, and wherein the second emitter is free of emitter separators perpendicular to the orientation direction in the collector segments nearest the emitter separators.

20. An integrated circuit, comprising:
a first collector including first and second noncontiguous collector regions;
a first emitter located between the first noncontiguous collector region and the second noncontiguous collector region;
a second emitter located between the first emitter and the second noncontiguous collector region; and
a second collector located between the first emitter and the second emitter.

21. The integrated circuit of claim 20, further comprising a third emitter between the second emitter and the second noncontiguous collector region, and a third collector located between the second emitter and the third emitter.

22. The integrated circuit of claim 20, wherein the first collector comprises a plurality of collector segments, the first noncontiguous collector region comprises a first subset of the collector segments, and the second noncontiguous collector region comprises a second subset of the collector segments.

* * * * *